United States Patent
Roy et al.

(10) Patent No.: US 9,384,842 B1
(45) Date of Patent: Jul. 5, 2016

(54) METHOD AND SYSTEM TO IMPROVE SOFT-PROGRAMMING TIME IN NON-VOLATILE MEMORY

(71) Applicant: FREESCALE SEMICONDUCTOR, INC., Austin, TX (US)

(72) Inventors: Anirban Roy, Austin, TX (US); Tom D. Vo, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/717,153

(22) Filed: May 20, 2015

(51) Int. Cl.
G11C 16/04 (2006.01)
G11C 16/14 (2006.01)
G11C 16/34 (2006.01)
G11C 16/16 (2006.01)

(52) U.S. Cl.
CPC ............ G11C 16/14 (2013.01); G11C 16/0483 (2013.01); G11C 16/16 (2013.01); G11C 16/344 (2013.01); G11C 16/3472 (2013.01); G11C 16/3404 (2013.01)

(58) Field of Classification Search
CPC ...... G11C 16/16; G11C 16/14; G11C 16/344; G11C 16/0483; G11C 16/3472; G11C 16/3404
USPC ............................. 365/185.18, 185.29, 185.3
See application file for complete search history.

(56) References Cited

U.S. PATENT DOCUMENTS

| | | | |
|---|---|---|---|
| 6,172,908 B1 | 1/2001 | Cappelletti et al. | |
| 6,240,023 B1 | 5/2001 | Roohparvar | |
| 6,252,803 B1 | 6/2001 | Fastow et al. | |
| 6,381,177 B1 | 4/2002 | De Sandre et al. | |
| 6,392,931 B1 | 5/2002 | Pasotti et al. | |
| 6,836,435 B2 * | 12/2004 | Li ...................... | G11C 16/3468 365/185.22 |
| 7,864,588 B2 * | 1/2011 | Betser ................ | G11C 16/0475 365/185.2 |
| 8,120,960 B2 * | 2/2012 | Varkony ................. | G11C 5/145 365/185.16 |
| 8,760,923 B2 * | 6/2014 | Mu ..................... | G11C 16/3468 365/185.11 |
| 9,082,493 B2 * | 7/2015 | He ......................... | G11C 16/16 |

OTHER PUBLICATIONS

Esseni et al, "Trading-Off Programming Speed and Current Absorption in Flash Memories with the Ramped-Gate Programming Technique", IEEE Transactions on Electron Devices, Apr. 2000, pp. 828-834, vol. 47, No. 4.

* cited by examiner

Primary Examiner — Pho M Luu

(57) ABSTRACT

A method of erasing a plurality of non-volatile memory (NVM) cells on a die includes applying erase signals to the plurality of NVM cells. A subset of the plurality of NVM cells is identified to be soft programmed. Information is identified from a non-volatile storage location that stores a value to identify a particular magnitude from a plurality of possible magnitudes of a starting voltage. A soft program signal is applied to the NVM cells identified for soft programming, wherein the starting voltage of the soft program signal has the particular magnitude.

20 Claims, 5 Drawing Sheets

METHOD AND SYSTEM TO IMPROVE SOFT-PROGRAMMING TIME IN NON-VOLATILE MEMORY

BACKGROUND

1. Field

This disclosure relates generally to semiconductor devices, and more specifically, to soft-programming over-erased memory cells.

2. Related Art

Non-volatile memory devices, such as EEPROM and flash memory, are used in computers and other electronic devices to store data and/or programming instructions that can be electrically erased and reprogrammed.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 1:
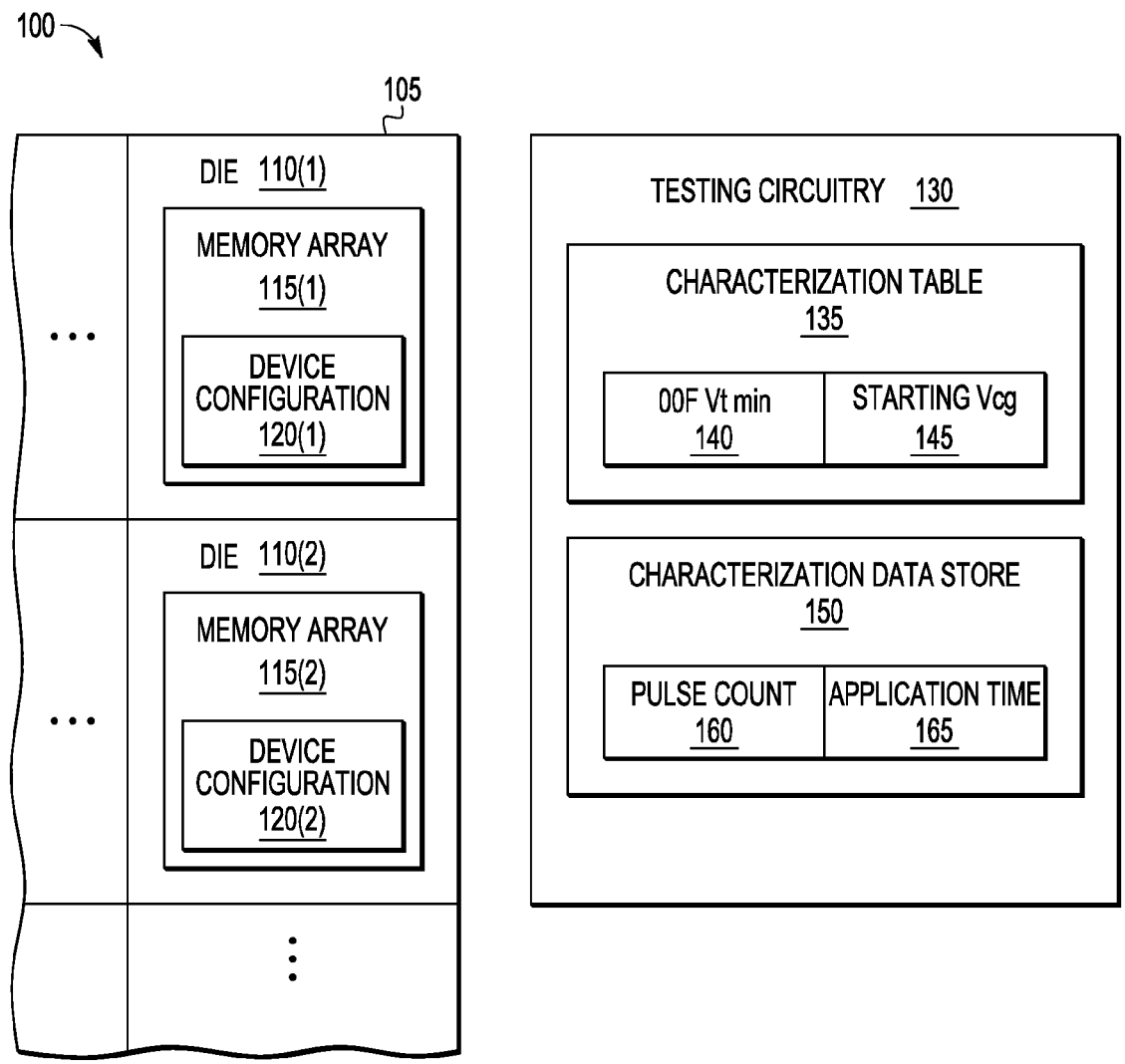
FIG. 1 illustrates a block diagram depicting an example manufacturing system in which the present disclosure is implemented, according to some embodiments.

The following sets forth a detailed description of various embodiments intended to be illustrative of the invention and should not be taken to be limiting.

Overview

Flash memory, or non-volatile memory, is used in a wide variety of electronic devices. Non-volatile memory includes a plurality of non-volatile memory (NVM) cells arranged in rows and columns of an array, where each NVM cell typically includes a floating gate, a control gate, a drain node, a source node, and a body (or bulk) node. Each NVM cell is programmed and erased by applying various voltage signals to one or more electrodes of the control gate, drain node, source node, and body node (e.g., to implement a Fowler-Nordheim (FN) tunneling operation or a hot carrier injection operation). When an NVM cell is programmed or erased, the charge on the floating gate changes, which changes the threshold voltage (Vt) of the NVM cell to enter either a program state or an erase state. Inconsistencies in the non-volatile memory manufacturing process (e.g., slight differences in oxide thickness, gate width and length dimensions) result in a wide variation of the device characteristics of the NVM cells, which affects how easily the threshold voltage is moved into the program state or the erase state during a program or erase operation. NVM cells in the program state have higher threshold voltages than NVM cells in the erase state, where the Vt of each programmed NVM cell is equal to or above a program verify voltage and where the Vt of each erased NVM cell is equal to or below an erase verify voltage.

During an erase operation, a constant control gate voltage is applied while the well voltage is ramped (e.g., a linearly increasing or decreasing voltage, or a stepped voltage including one or more pulses of voltage). The NVM cells of non-volatile memory are often erased in blocks, or groups of NVM cells (e.g., each block including one or more rows of NVM cells in the NVM array). Some NVM cells in a given block may have device characteristics that make it relatively harder to move the threshold voltage to the erase state, as compared to other NVM cells in the block (e.g., a constant control gate voltage along with a ramping well voltage must be applied for a longer period of time to successfully move the threshold voltage to below the erase verify voltage). For example, the threshold voltages of some NVM cells quickly reach the erase state after a shorter amount of time, while the threshold voltages of other NVM cells slowly reach the erase state after a longer amount of time. Since the threshold voltages of NVM cells in a block reach the erase state at different times, a successfully (or quickly) erased NVM cell may continue to be exposed to erase conditions (or signals) while nearby NVM cells are still being erased. An over-exposed NVM cell often becomes an over-erased NVM cell as the erase conditions continue to lower the NVM cell's threshold voltage to a negative voltage, which leads to various device problems such as excessive leakage.

Once the erase operation is complete and the threshold voltages have been erased to an erase verify level, a soft-program operation is performed (e.g., a "mild version" of a program operation). An over-erased NVM cell may be soft-programmed to reduce leakage. A soft-program control gate voltage (also referred to herein as a soft-program Vcg) is applied to the NVM cell's control gate and is ramped up in order to raise the over-erased threshold voltage to the erase state, which is defined as being greater than or equal to a soft-program verify voltage and less than or equal to the erase verify voltage. In other words, the erase state includes threshold voltages that are below the erase verify voltage and above a minimum erased threshold voltage. A soft-program verify voltage may be defined at zero or at a small positive threshold voltage to ensure leakage is minimized. Over-erased threshold voltages may be a negative threshold voltage or a small positive threshold voltage that is less than the soft-program verify voltage.

Conventional soft-programming takes a relatively long amount of time to complete for a number of reasons. Soft-programming is typically performed slowly with low bias to ensure the NVM cell does not leave the erase state (e.g., ensure the threshold voltage of the NVM cell is not programmed above the erase verify voltage). The threshold voltages of the most over-erased NVM cells (e.g., most negative threshold voltage) often take the longest time to soft-program back to the erase state.

Also, as the overall number of NVM cells in a block increases (e.g., the NVM array becomes wider), the number of "slow-to-erase" NVM cells and the number of "quick-to-erase" NVM cells increases, where the increased number of quick-to-erase NVM cells results in an increased number of over-erased NVM cells (due to continued exposure of the quick-to-erase NVM cells to erase conditions while nearby slow-to-erase NVM cells are erased). While soft-programming may be performed in parallel per row, the increased number of over-erased NVM cells will likely occupy various additional rows, where each additional row increases the soft-programming time.

Finally, the soft-program Vcg applied to the NVM cell's control gate increases from a starting voltage to a stopping voltage in order to raise the threshold voltage of the NVM cell. The starting and stopping voltages are often set at values that account for the wide variation of the device characteristics of the NVM cells, ensuring that even the most over-erased NVM cells (e.g., a universal worst-case over-erased NVM cell) are moved into the erase state.

The starting voltage is often set at an anticipated most over-erased threshold voltage (e.g., having a least positive or most negative value) of all NVM cells produced by the fabrication facility to ensure that the most over-erased NVM cells are exposed to the soft-program Vcg for a longer period of time, even if the particular set of NVM cells being soft-programmed do not carry an over-erased threshold voltage that requires starting at the anticipated most over-erased threshold voltage. The stopping voltage is also often set to a voltage much larger than the soft-program verify voltage in order to ensure that the most over-erased NVM cells are exposed to a greater soft-program Vcg that should successfully raise the threshold voltage over the soft-program verify voltage. However, even if the soft-program Vcg that is provided to an over-erased NVM cell is subsequently stopped when the over-erased NVM cell reaches the erase state (or reaches a minimum erased Vt), the soft-program operation must still wait for all over-erased NVM cells on that particular row to reach the erase state.

By setting the starting and stopping voltages to soft-program the universal worst-case over-erased NVM cell, a maximum range of soft-program Vcg is utilized for all over-erased NVM cells, regardless of whether the particular set of NVM cells being soft-programmed actually requires such a voltage range. Accordingly, soft-programming over-erased NVM cells on each additional row takes a maximum amount of time waiting for the soft-program Vcg to traverse the maximum soft-program Vcg range. For at least these reasons, soft-programming time consumes a significant portion of the total erase time of the non-volatile memory.

The present disclosure provides embodiments of a scheme to improve soft-programming time in non-volatile memories, based on device characteristics of NVM cells of a non-volatile memory, as described below.

As a side effect of the manufacturing process, an initial charge is produced on the floating gate, which is referred to herein as an initial or "out-of-fab" threshold voltage. This "natural" state may vary quite a bit across the NVM cells manufactured by the same fabrication facility, even for NVM cells that are manufactured on a same die. The natural state also varies across NVM cells of different die, which may be produced from the same wafer or produced from different wafers. Although the NVM cells are exposed to a similar amount of charge during the manufacturing process, some NVM cells carry a comparatively higher OOF threshold voltage (e.g., likely due to the NVM cell having device characteristics that move such charge easily to the floating gate), while other NVM cells carry a comparatively lower OOF threshold voltage (e.g., likely due to the NVM cell having device characteristics that move such charge less easily to the floating gate). The OOF threshold voltage can be used to characterize the NVM cells, which have a wide variety of device characteristics, in order to improve efficiency of soft-programming.

Figure 2:
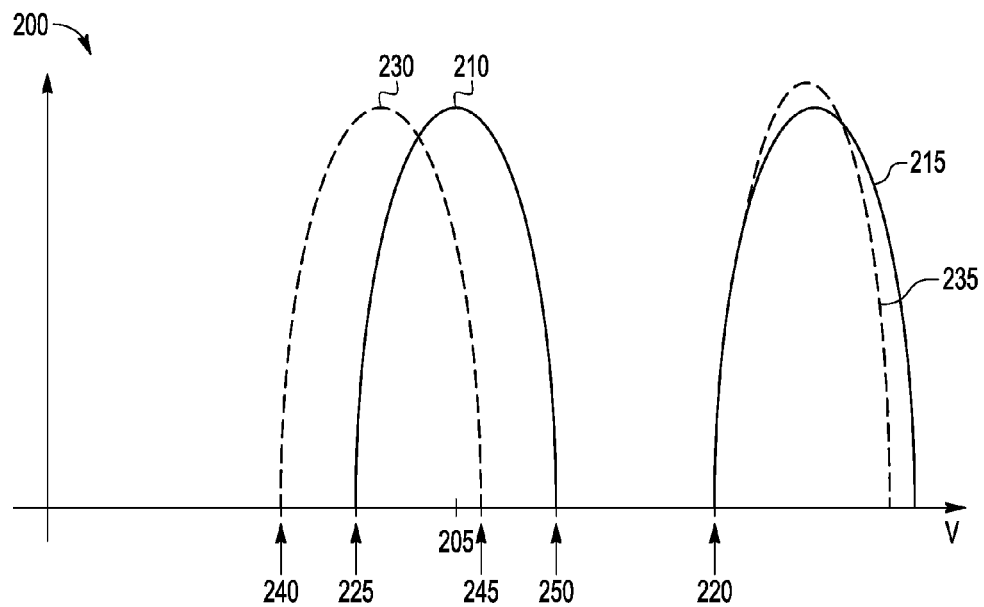
FIGS. 2, 3, and 4 illustrate plot graphs depicting example out-of-fabrication, program, erase, and soft-program threshold voltage distributions of memory cells, according to some embodiments.

In order to efficiently soft-program the over-erased NVM cells in a collection of NVM cells, a minimum OOF Vt of the collection of NVM cells being soft-programmed is used to characterize the collection of NVM cells. The OOF threshold voltages of the NVM cells manufactured by the fabrication facility (e.g., a number of NVM cells that are included on a single die, or on multiple die, or on a single wafer, or on multiple wafers, etc.) can be represented by an OOF threshold voltage (Vt) distribution curve. Generally, as the number of NVM cells increases, the width of the Vt distribution also increases due to a greater variation of threshold voltages carried by the NVM cells. Example OOF Vt distribution curves are illustrated in FIG. 2 on a plot graph having the x-axis representing threshold voltage levels of NVM cells manufactured by a fabrication facility and the y-axis representing a number of NVM cells (or bits) having a particular threshold voltage level. A first OOF Vt distribution curve 210 represents a distribution of OOF threshold voltages carried by a first set of NVM cells before any program or erase operations have been performed on the first set of NVM cells, spanning from a minimum OOF Vt 225 to a maximum OOF Vt 250. A second OOF Vt distribution curve 230 represents a distribution of the OOF threshold voltages carried by a second set of NVM cells before any program or erase operations have been performed on the second set of NVM cells, spanning from a minimum OOF Vt 240 to a maximum OOF Vt 245. Both OOF Vt distribution curves 210 and 230 overlay a normal read voltage Vt 205.

When NVM cells of a non-volatile memory are programmed after manufacture (e.g., the NVM cells are in the natural state immediately before programming), the threshold voltage (Vt) distribution of the NVM cells shifts from the OOF Vt distribution to a program Vt distribution. A first program Vt distribution curve 215 represents a distribution of programmed threshold voltages carried by the first set of NVM cells after a program operation is performed on the first set of NVM cells. A second program Vt distribution curve 235 represents a distribution of programmed threshold voltages carried by the second set of NVM cells after a program operation is performed on the second set of NVM cells. In this example, both curves 215 and 235 have a minimum program Vt 220 that is equal to the program verify voltage.

A relationship exists between an OOF Vt distribution and a corresponding program Vt distribution, due to the device characteristics of the corresponding set of NVM cells. The greater the difference between the minimum OOF Vt and the minimum program Vt (or program verify voltage), the greater the likelihood that the collection of NVM cells need to be programmed "harder" to ensure that all OOF threshold voltages are successfully moved to the program state. For example, a difference between minimum OOF Vt 240 and minimum program Vt 220 is comparatively larger than a difference between minimum program Vt 225 and minimum program Vt 220, indicating that the second set of NVM cells (associated with minimum OOF Vt 240) will likely require harder programming than the first set of NVM cells (associated with minimum OOF Vt 225). Hard programming includes applying a program control gate voltage for a longer period of time, or applying a greater program control gate voltage, to successfully program the NVM cells (e.g., to ensure that all OOF threshold voltages, including minimum OOF Vt 240 and 225, of the NVM cells reach the program state).

Figure 3:
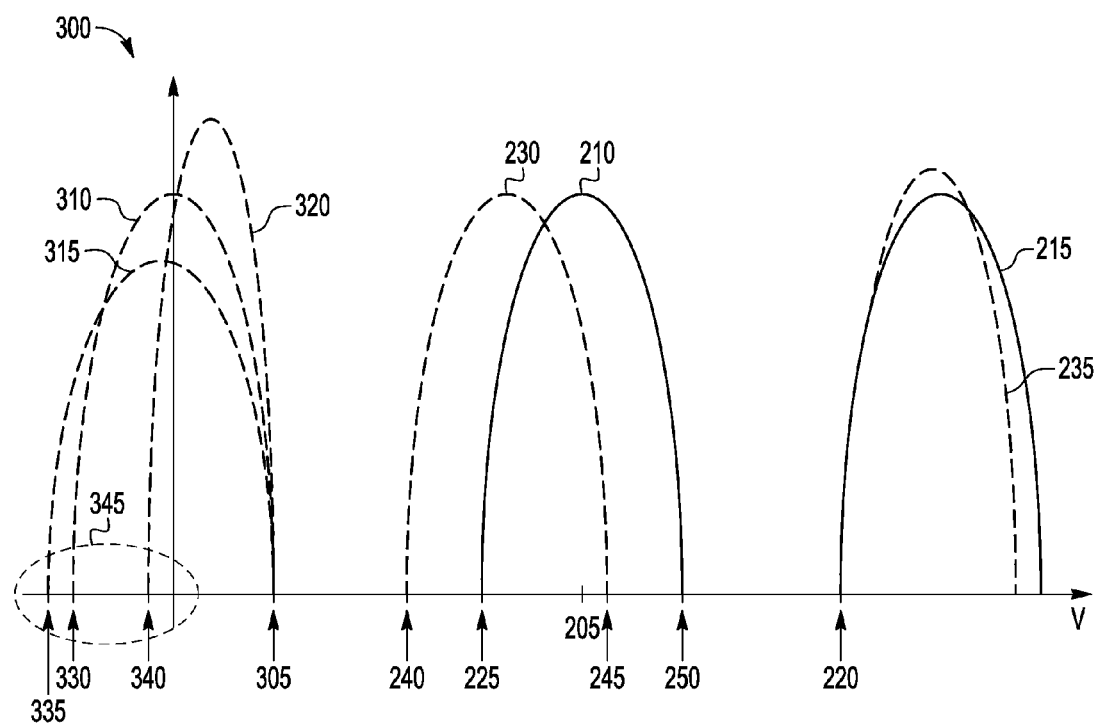

Example erase Vt distribution curves are illustrated in FIG. 3 on a plot graph similar to the plot graph shown in FIG. 2. A first erase Vt distribution curve 310 represents a distribution of erase threshold voltages carried by the first set of NVM cells after an erase operation is performed on the first set of NVM cells, which has a minimum erase Vt 330. A second erase Vt distribution curve 315 represents a distribution of the erase threshold voltages carried by the second set of NVM cells after an erase operation is performed on the second set of NVM cells, which has a minimum erase Vt 335. A third erase Vt distribution curve 320 that also represents a distribution of the erase threshold voltages carried by a third set of NVM cells after an erase operation is performed on the third set of NVM cells, which has a minimum erase Vt 340. All three curves have a maximum erase Vt 305 that is equal to or less than the erase verify voltage. All three curves have minimum erase threshold voltages that are negative and thus fall into an over-erased state, resulting in leakage. The minimum erase threshold voltages of the three curves fall in scatter region 345, where the area under each curve in the negative Vt range indicates different numbers of over-erased NVM cells.

One cannot extrapolate an erase distribution of the NVM cells (and thus cannot extrapolate the number of over-erased NVM cells) from a program Vt distribution since electron transport during a program operation and during an erase operation depends differently upon the oxide electric field (e.g., channel hot electron injection during a program operation compared with FN tunneling during an erase operation). As a consequence, an erase Vt distribution cannot be correlated with a program Vt distribution. However, the relationship from the OOF state to the program state can be used to estimate the relationship from the over-erased state to the erase state. Since the NVM cells still possess the same device characteristics as when the NVM cells were programmed from the natural state, the NVM cells behave similarly when soft-programmed from the over-erased state. In other words, if a particular set of NVM cells required harder programming, the NVM cells will also require harder soft-programming. "Hard" soft-programming includes applying a soft-program Vcg for a longer period of time, or applying a greater soft-program Vcg, to successfully soft-program the over-erased NVM cells.

Figure 4:
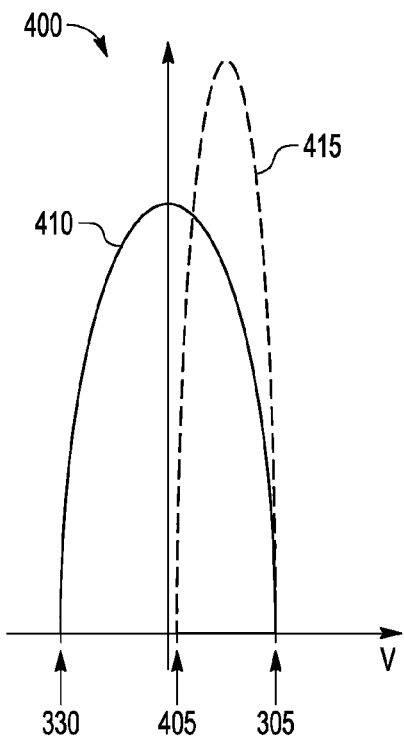

An example erase Vt distribution curve and associated soft-program Vt distribution curve are illustrated in FIG. 4 on a plot graph similar to the plot graph shown in FIG. 3. Erase Vt distribution curve 410 represents a distribution of erase threshold voltages carried by a set of NVM cells (such as the first set of memory cells discussed in connection with FIGS. 2 and 3) after an erase operation has been performed on the NVM cells, which has a minimum erase Vt 330. Part of distribution curve 410 falls below a soft-program verify voltage 405, where the NVM cells having those threshold voltages below soft-program verify voltage 405 are over-erased. Soft-program Vt distribution curve 415 represents a distribution of soft-program threshold voltages carried by the set of NVM cells after a soft-program operation has been performed on the over-erased NVM cells. Soft-program Vt distribution curve 415 has threshold voltages that span from a minimum Vt 405, which is equal to or greater than the soft-program verify voltage, to a maximum Vt 305, which is less than or equal to the erase verify voltage. The soft-program operation performed on the NVM cells was harder in order to ensure that all over-erased threshold voltages, including the most over-erased threshold voltage (e.g., the least positive or most-negative Vt) such as minimum Vt 330, of the over-erased NVM cells reach the erase state (e.g., are moved to be equal to or greater than soft-program verify voltage 405).

As a result of this relationship, the minimum OOF Vt of the collection of NVM cells can be used as a soft-program performance indicator for the collection of NVM cells. In other words, the minimum OOF Vt of the collection of NVM cells can be used to tailor the soft-programming conditions to the particular collection of NVM cells being soft-programmed. The soft-programming conditions are based on soft-program parameters, such as the values of the starting and stopping voltages of the soft-program Vcg. The starting voltage of the soft-program Vcg is targeted to be close to, but greater than, the minimum OOF Vt of the collection of NVM cells in order to "pick up" the over-erased NVM cells, preventing the soft-program Vcg from being unnecessarily ramped from a too-small starting voltage that would unnecessarily lengthen the soft-programming time. However, the starting voltage also cannot be too large, which might cause a current surge capable of collapsing the charge pump used to drive the bitlines.

Also, the minimum OOF Vt indicates whether the NVM cells should be soft-programmed "harder." For example, a smaller minimum OOF Vt indicates that the NVM cells will be more difficult to program and need to be soft-programmed harder, which corresponds to a larger stopping voltage that applies a greater soft-program Vcg to the over-erased NVM cells. Since the soft-program Vcg is increased at a steady or constant rate from the starting voltage, the stopping voltage is a result of a function of time. In other words, the smaller minimum OOF Vt corresponds to a longer period of time during which the soft-program Vcg is applied to the over-erased NVM cells. By contrast, a larger minimum OOF Vt indicates that the NVM cells will be less difficult to program and need not be soft-programmed as hard, which corresponds to a shorter period of time during which the soft-program Vcg is applied to the over-erased NVM cells. A shorter period of time results in a smaller stopping voltage of the soft-program Vcg, which prevents the soft-program Vcg from being unnecessarily ramped to a too-large stopping voltage that would unnecessarily lengthen the soft-programming time.

By tailoring the starting voltage of the soft-program Vcg to the minimum OOF Vt of a collection of NVM cells on a die and optimizing the amount of time during which the soft-program Vcg is applied to the over-erased NVM cells, the soft-program time for a collection of NVM cells is optimized. When considering the large number of die produced by a fabrication facility that have NVM cells requiring erasure, performing soft-programming within an optimized amount of time on each collection of NVM cells reduces the overall soft-program time for the large number of collections of NVM cells requiring erasure, even if some collections of NVM cells still require a maximum amount of soft-program time (as compared to always performing soft-programming within a maximum amount of soft-program time for all collections of NVM cells to account for a universal worse-case over-erased NVM cell). By reducing the overall soft-program time, the overall erase time is also reduced.

EXAMPLE EMBODIMENTS

FIG. 1 illustrates a block diagram depicting an example manufacturing system 100 (or simply system 100) in which the present disclosure is implemented. System 100 is configured to implement a manufacturing process to produce a semiconductor wafer 105 that includes an N number of die, illustrated as 110(1)-(N) die. Each die 110 includes at least one non-volatile memory (NVM) array 115 (also referred to as a memory array 115), which in turn includes a plurality of NVM cells (also referred to as memory cells). While the embodiment shown in FIG. 1 illustrates each die 110 having a single memory array 115, other embodiments provide that each die 110 has one or more memory arrays 115. Each memory array 115 includes a separate storage area (e.g., a number of reserved memory cells) designated for storing device configuration information 120 corresponding to the memory array 115, where the separate storage area is not user-accessible. Device configuration information 120 is further described below.

System 100 also includes testing circuitry 130. At a time after wafer 105 is manufactured and before any program or erase operation is performed on memory array 115, testing circuitry 130 is configured to measure the out-of-fabrication (OOF) threshold voltage of each memory cell in memory array 115 on a given die 110 of wafer 105 during an initial portion of a test phase of the manufacturing process (also referred to as wafer sort testing). Testing circuitry 130 is also configured to determine a minimum OOF threshold voltage (Vt) as the smallest or lowest measured OOF threshold voltage of the number of OOF threshold voltages measured from the memory cells on the given die 110. In some embodiments, a minimum OOF Vt is determined for each memory array 115 (where each memory array is a separate collection of memory cells) on a die 110, where die 110 includes one or more memory arrays. In other embodiments, a minimum OOF Vt is determined for all memory arrays 115 (where the memory arrays together form a single collection of memory cells) on die 110. In some embodiments, testing circuitry 130 is also configured to use the measured OOF threshold voltages of the memory cells to generate an OOF Vt distribution of the collection of memory cells (whether for a single memory array or multiple memory arrays) and determine the minimum OOF Vt from the generated OOF Vt distribution.

Once the minimum OOF Vt is determined for the given collection of memory cells (either for a single memory array or for a group of multiple memory arrays on the die), testing circuitry 130 is configured to store the minimum OOF Vt on the die as device configuration information 120. In some embodiments where each memory array is a separate collection of memory cells on the die, a respective minimum OOF Vt is determined and stored for each corresponding collection of memory cells on the die. In other embodiments where multiple arrays form a single collection of memory cells on the die, a single minimum OOF Vt for the collection of memory cells is determined and stored in each memory array. In this manner, some embodiments utilize a different minimum OOF Vt to soft-program each corresponding collection of NVM cells on the die, while other embodiments utilize a single minimum OOF Vt to soft-program all collections of NVM cells on the die. During a subsequent portion of the test phase (e.g., soft-program sequence) of the manufacturing process, the device configuration information 120 of a given memory array 115 is read and used to determine a corresponding starting Vcg for soft-programming any over-erased NVM cells in memory array 115, as further described below.

Testing circuitry 130 is further configured to implement a characterization process for each die 110 on wafer 105 that results in erasure of the memory cells on die 110. The characterization process includes performing a precondition sequence, an erase sequence, and a soft-program sequence. The characterization process is performed for each memory array 115 on the given die 110. During the soft-program sequence of the characterization process, a characterization profile of the particular collection of memory cells being soft-programmed (e.g., memory array 115) is obtained, which is used to adapt or optimize the soft-program conditions to the particular collection of memory cells being soft-programmed. The characterization process is further discussed below.

An example characterization process includes a precondition (or program) sequence that is performed on the memory cells in memory array 115. The precondition sequence is performed on the memory array 115 block by block, where a block is a group of memory cells (e.g., a number of rows of memory cells). The precondition sequence implements a program operation, such as a hot carrier injection operation, where a number of program signals (or program conditions) are applied to electrodes of the memory cells of memory array 115 to move the threshold voltages of the memory cells within a present block into (or closer to) a program state. An example program control gate voltage is in the range of 6V to 10V. The precondition sequence also implements a program verify operation to determine whether any memory cells within the present block are not yet in the program state (e.g., any memory cells having a threshold voltage less than the program verify voltage). The program verify operation tests each memory cell in the present block to read the threshold voltage of the memory cells and checks whether the threshold voltage is less than a program verify voltage. If any memory cells are not yet programmed within the present block (or have a threshold voltage less than the program verify voltage), testing circuitry 130 is configured to perform another iteration of the precondition sequence for the present block by again performing the program operation and the program verify operation on the present block. Once the memory cells of the present block are successfully programmed (e.g., all threshold voltages are equal to or greater than the program verify voltage), the precondition sequence is performed for the memory cells in the next block until the entire memory array 115 is programmed. In some embodiments, testing circuitry 130 is also configured to use the threshold voltages measured during the precondition sequence to generate a precondition or program Vt distribution of the collection of memory cells (whether for a single memory array or multiple memory arrays).

The characterization process also includes an erase sequence that is performed on the memory cells in memory array 115, which is also performed on the memory array 115 block by block (also referred to as a bulk erase operation). The erase sequence implements an erase operation, such as a Fowler-Nordheim tunneling operation, where a number of erase signals (or erase conditions) are applied to electrodes of the memory cells of memory array 115 to move the threshold voltages of the memory cells into (or closer to) an erase state. The erase sequence also implements an erase verify operation to determine whether any memory cells within a present block are not yet in the erase state (e.g., any memory cells having a threshold voltage greater than the erase verify voltage). The erase verify operation tests each memory cell in the present block to read the threshold voltage of a memory cell and checks whether the threshold voltage is greater than an erase verify voltage. If any memory cells are not yet erased within the present block (or have a threshold voltage greater than the erase verify voltage), testing circuitry 130 is configured to perform another iteration of the erase sequence for the present block by again performing the erase operation and the erase verify operation on the present block. Once the memory cells of the present block are successfully erased (e.g., all threshold voltages are equal to or less than the erase verify voltage), the erase sequence is performed for the memory cells in the next block until the entire memory array 115 is erased. In some embodiments, testing circuitry 130 is also configured to use the threshold voltages measured during the erase sequence to generate an erase Vt distribution of the collection of memory cells (whether for a single memory array or multiple memory arrays)

The characterization process also includes a soft-program sequence that is applied to the memory cells in memory array 115, which is performed on the memory array 115 row by row within a block. The soft-program sequence includes two parts. A first part of the soft-program sequence implements a preliminary soft-program verify operation to determine whether any memory cells in a present block are in the over-erased state (e.g., any cells having a threshold voltage less than the soft-program verify voltage). The preliminary soft-program verify operation tests each memory cell in the present block to read the threshold voltage of a memory cell and checks whether the threshold voltage is less than a soft-program verify voltage. In some embodiments, testing circuitry 130 is also configured to use the threshold voltages measured during the preliminary soft-program verify operation to generate an erase distribution of the collection of memory cells (whether for a single memory array or multiple memory arrays).

If any memory cells in the present block are over-erased (or have a threshold voltage that is less than the soft-program verify voltage), the soft-program sequence continues to a second part that implements a soft-program operation, such as a hot carrier injection operation, performed on the over-erased memory cells within the present block. During the soft-program operation, a number of soft-program signals (or soft-program conditions) are applied to the electrodes of any over-erased memory cells to move the threshold voltages of the over-erased memory cells into (or closer to) the erase state. The soft-program conditions include a soft-program Vcg (e.g., on the order of 1.5V) that is applied to the control gate of each over-erased memory cell within the present block for some amount of time, as further discussed below. The soft-program Vcg is less than the program Vcg (applied during a program operation) to ensure the memory cells are not programmed over the erase verify level. The second part of the soft-program sequence also implements a soft-program verify operation to determine whether any of the over-erased memory cells are still over-erased (e.g., any memory cells still have a threshold voltage less than the soft-program verify voltage). The soft-program verify operation tests each memory cell in the present block to read the threshold voltage of a memory cell and checks whether the threshold voltage is less than a soft-program verify voltage. If any memory cells are still over-erased, testing circuitry 130 is configured to perform another iteration of the second part of the soft-program sequence for the still over-erased memory cells in the present block (and does not repeat the preliminary soft-program verify operation for the present block). Once the memory cells of the present block are successfully soft-programmed (e.g., all threshold voltages are above the soft-program verify voltage), the soft-program sequence is performed for the memory cells in the next block until the entire memory array 115 is soft-programmed, which completes the characterization process for the present memory array 115. Testing circuitry 130 is also configured to use the threshold voltages measured during the soft-program verify operation of the second part of the soft-program sequence to generate a soft-program Vt distribution of the collection of memory cells (whether for a single memory array or multiple memory arrays).

The soft-program control gate voltage (Vcg) is a ramped voltage applied to the control gate of each over-erased memory cell within a row of the present block during the soft-program operation. The soft-program Vcg is a monotonic function that is increased from a starting voltage (also referred to as a starting Vcg) for a period of soft-program time to reach a stopping voltage (also referred to as a stopping Vcg). Testing circuitry 130 supports a linearly increasing soft-program Vcg implementation (e.g., a soft-program Vcg represented by a linear curve or piecewise linear curve), as well as a stepwise increasing soft-program Vcg implementation (e.g., a soft-program Vcg represented by a stepped curve or pulsed curve), where the implementation of the soft-program Vcg is selectable at a time prior to manufacturing wafers (e.g., by an admin of system 100).

A linearly increasing soft-program Vcg is linearly ramped or increased at some predefined constant ramp rate from the starting Vcg for some amount of time. A stepped soft-program Vcg is ramped or increased by a number of discrete steps or pulses from the starting Vcg, where the pulses have a uniform height (e.g., voltage) and length (e.g., time). In both cases, the soft-program Vcg is ramped or increased at a constant rate from the starting Vcg, meaning that the value of the stopping Vcg is a function of time.

Figure 7:
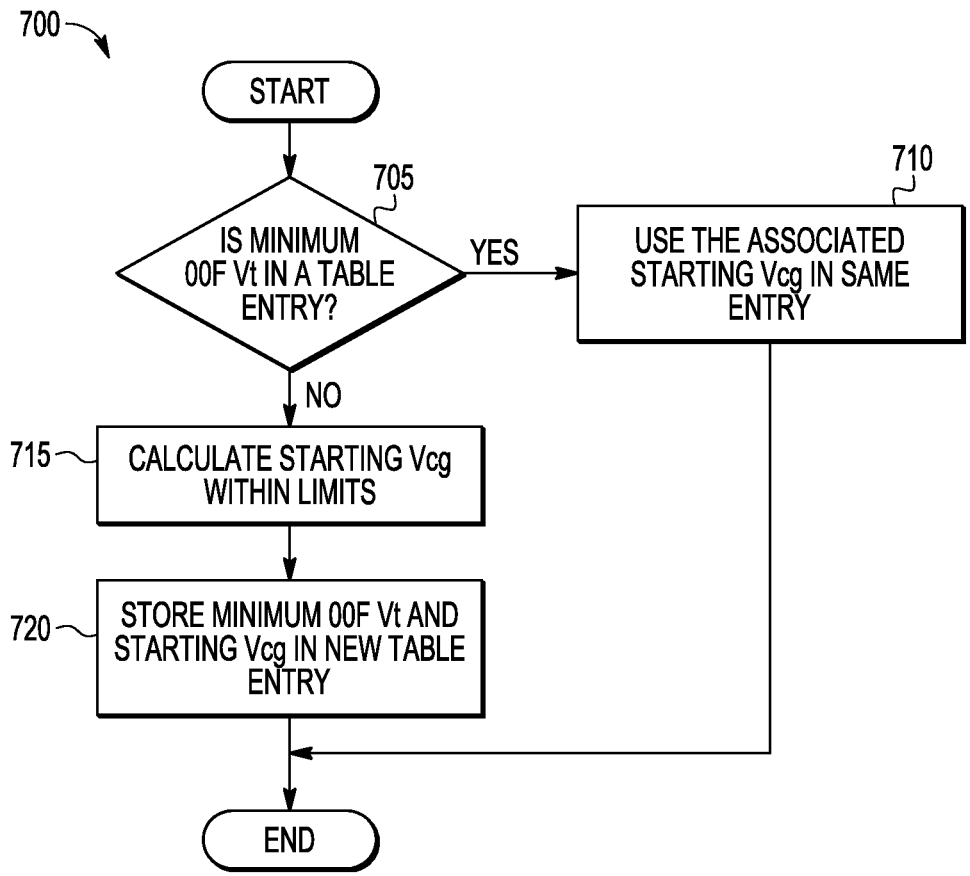
FIGS. 7 and 8 illustrate flowcharts depicting example processes for determining soft-program parameters, according to some embodiments.

Testing circuitry 130 is also configured to determine soft-program parameters to tailor the soft-program conditions to the collection of memory cells being soft-programmed. Testing circuitry 130 is configured to determine a starting Vcg of the soft-program Vcg based on a present minimum OOF threshold voltage associated with the memory array 115, which testing circuitry 130 reads from device configuration information 120 of the memory array 115. An example process for determining the starting Vcg performed by testing circuitry 130 is illustrated in FIG. 7. The process begins at operation 710, where testing circuitry 130 is configured to check whether a present minimum OOF Vt that is associated with the present collection of memory cells (e.g., memory array 115) being soft-programmed is included in an entry of characterization table 135. Characterization table 135 includes a plurality of table entries, where each entry includes a minimum OOF Vt 140 and an associated starting Vcg 145. In one embodiment, the table entries in characterization table 135 are ordered by increasing value of minimum OOF Vt 140. If the present minimum OOF Vt is included in a given entry of characterization table 135, the process continues to operation 710, where testing circuitry 130 selects the starting Vcg 145 in the given entry for use in the soft-program sequence applied to the memory array 115. The process for determining the starting Vcg then ends.

Returning to operation 705, if the present minimum OOF Vt is not included in an entry of characterization table 135, the process continues to operation 715, where testing circuitry 130 is configured to calculate the starting Vcg of the soft-program Vcg based on the minimum OOF threshold voltage associated with the memory array 115. The starting Vcg is calculated to be greater than the minimum OOF Vt, but not so great as to cause a current surge that may collapse the charge pump driving the control gate voltage (e.g., an upper limit). In other words, the starting Vcg is proportional to the minimum OOF Vt. The process continues to operation 720, where testing circuitry 130 is configured to store the present minimum OOF Vt with the calculated starting Vcg in a new entry of characterization table 135. The process for determining the starting Vcg then ends.

If the soft-program Vcg is stepped, testing circuitry 130 is also configured to quantize the starting Vcg (whether selected from characterization table 135 or calculated) to the available voltage step settings based on a Vcg step value look-up table (not shown). In other words, testing circuitry 130 selects a voltage step magnitude from among a number of possible voltage step magnitudes that is closest to the value of the starting Vcg and utilizes the voltage step magnitude as the starting Vcg.

Figure 8:
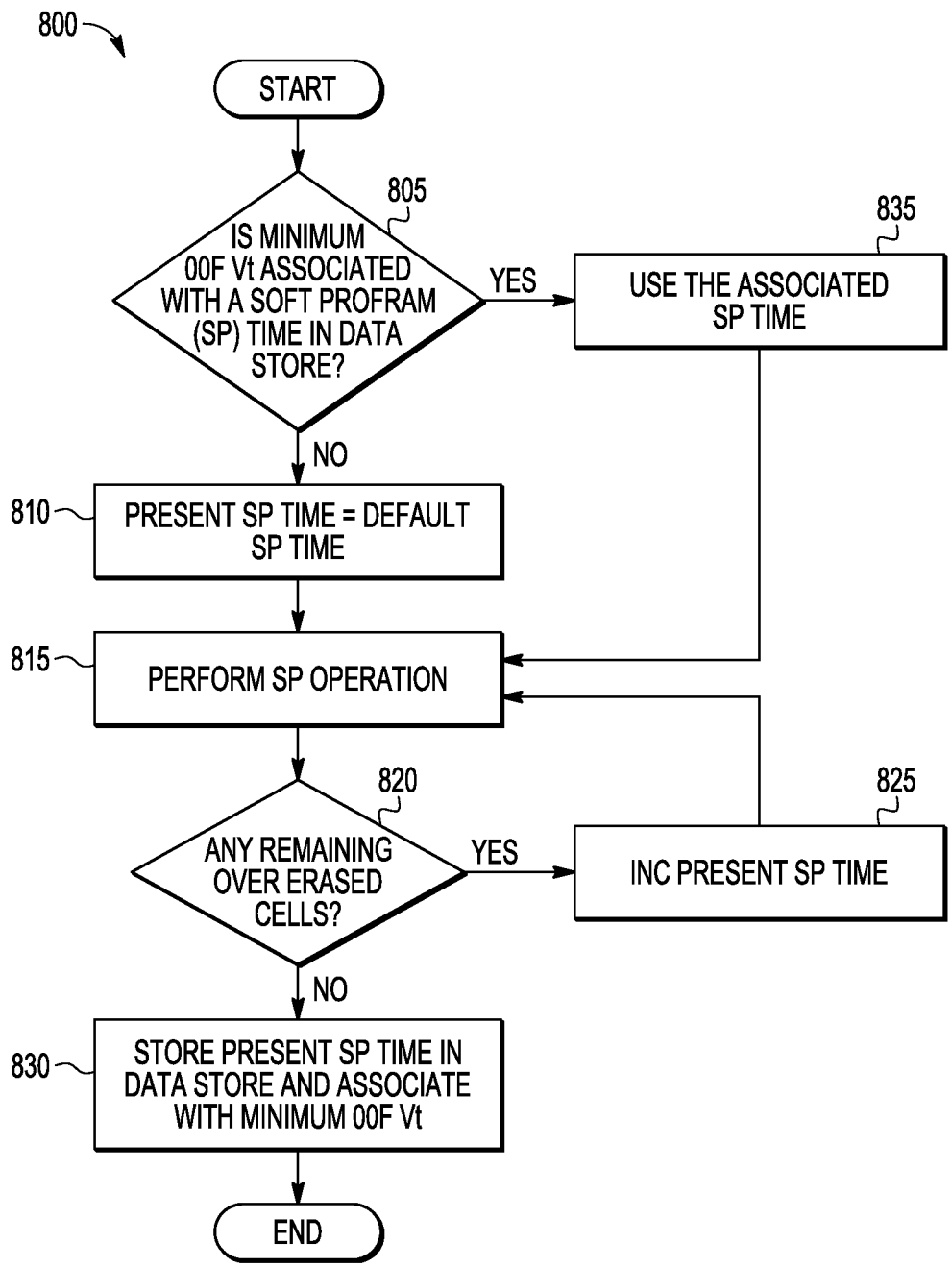

Testing circuitry 130 is also configured to determine a soft-program time, which is a period of time during which the soft-program Vcg is applied to the memory cells being soft-programmed, based on the present minimum OOF Vt. An example process for determining the soft-program time performed by testing circuitry 130 is illustrated in FIG. 8. The process begins at operation 805, where testing circuitry 130 is configured to check whether the present minimum OOF Vt is associated with a soft-program time in characterization data store 150. Characterization data store 150 stores a plurality of entries, where each entry includes a pulse count 160 and an application time 165. Each entry of characterization data store 150 is associated with a minimum OOF Vt 140 stored in characterization table 135 (e.g., a pointer or other data structure associates a minimum OOF Vt 140 with a corresponding entry in characterization data store 150, or each minimum OOF Vt 140 is also stored in the same corresponding entry in characterization data store 150). Pulse count 160 is utilized as the soft-program time when the soft-program Vcg implemented in system 100 is stepped, and application time 165 is utilized as the soft-program time when the soft-program Vcg implemented in system 100 is linearly increased.

If the present minimum OOF Vt is associated with a soft-program time in characterization data store 150, the process continues to operation 835, where testing circuitry 130 utilizes the soft-program time associated with the present minimum OOF Vt. Testing circuitry 130 utilizes the associated pulse count or associated application time, as appropriate for the soft-program Vcg that is implemented in system 100. The process then continues to operation 815, which is further discussed below.

Returning to operation 805, if the present minimum OOF Vt is not associated with a soft-program time in characterization data store 150, the process continues to operation 810, where testing circuitry 130 is configured to use a default or predefined soft-program time. A default soft-program time value can be predefined for one or more ranges of threshold values. If the present minimum OOF Vt falls within a range of smaller OOF Vt values, this generally indicates that the memory cells will be more difficult to soft-program and need to be soft-programmed "harder," which corresponds to a longer default application time (for a linearly increasing soft-program Vcg) or a greater default number of soft-program pulses (for a stepped soft-program Vcg). If the present minimum OOF Vt falls within a range of larger OOF Vt values, this generally indicates that the memory cells will be less difficult to soft-program and need not be soft-programmed as "hard," which corresponds to a shorter default application time (for a linearly increasing soft-program Vcg) or a smaller default number of soft-program pulses (for a stepped soft-program Vcg). In some embodiments, the default soft-program time is predefined as being a time that will result in over-erased memory cells (e.g., the default soft-program time is underestimated in order to allow testing circuitry 130 increase the default soft-program time to determine the optimized soft-program time in operations 815, 820, and 825, as discussed below). The default soft-program time is temporarily stored (e.g., in a buffer) as a present soft-program time.

Testing circuitry 130 is also configured to optimize the soft-program time on an experimental basis in operations 815, 820, and 825, where testing circuitry 130 is configured to track whether a present soft-program time results in the threshold voltages of the over-erased memory cells being successfully moved into the erased state. In operation 815, testing circuitry 130 performs the soft-program operation utilizing the present soft-program time (e.g., utilizes the default pulse count or default application time, as appropriate for the soft-program Vcg that is implemented in system 100).

The process continues to operation 820, where testing circuitry 130 performs a soft-program verify operation to determine whether there are any remaining over-erased memory cells. Testing circuitry 130 checks the threshold voltage of each memory cell and determines whether any still fall below a soft-program verify voltage. If any over-erased memory cells remain, the operation continues to operation 825, where the present soft-program time is incremented by some amount (e.g., a present pulse count is increased by one or more pulses, or a present application time is lengthened by one or more microseconds). The process returns to operation 815, where another iteration of the soft-program operation is performed utilizing the present (lengthened) pulse count.

Returning to operation 820, if no over-erased memory cells remain, the present soft-program time has been optimized for the collection of memory cells having the present minimum OOF Vt. Testing circuitry 130 stops or terminates application of the soft-program Vcg. The process continues to operation 830, where testing circuitry 130 stores the soft-program time in a new entry of characterization data store 150 that is associated with the present minimum OOF Vt, which is stored as OOF Vt min 140 in characterization table 135. If the soft-program Vcg implemented in system 100 is stepped, testing circuitry 130 is also configured to translate the present pulse count into an application time 165 that results in an equivalent stopping Vcg when applied to a starting Vcg (e.g., the equivalent application time would be the pulse length multiplied by the pulse count). Similarly, if the soft-program Vcg implemented in system 100 is linearly increased, testing circuitry 130 is configured to translate the present application time into a pulse count 160 that results in a substantially equivalent stopping Vcg when applied to a starting Vcg (e.g., the equivalent pulse count would be the present application time divided by the pulse length, where any remainder would be rounded up or down to provide an integer pulse count). Testing circuitry 130 may also consult a Vcg step value look-up table (not shown) when translating an application time into a pulse count. The process for determining the soft-program time then ends.

In this manner, each entry in characterization data store 150 serves as a characterization profile for a given minimum OOF Vt, where the characterization profile provides an optimized soft-program time to be utilized when soft-programming a collection of memory cells that have the given minimum OOF Vt. In other words, the characterization process correlates (e.g., defining a correlation between) a minimum OOF Vt and an optimized soft-program time. As testing circuitry 130 encounters additional collections of memory cells, each having a different minimum OOF Vt, a plurality of characterization profiles are collected and stored. The characterization profiles can be used to efficiently soft-program subsequently-received collections of memory cells.

In some embodiments, if a minimum OOF Vt already stored in characterization table 135 is within some range of the present minimum OOF Vt of a particular collection of memory cells, testing circuitry 130 utilizes the starting Vcg in the entry containing the stored minimum OOF Vt that is closest to the present minimum OOF Vt. Testing circuitry 130 also utilizes the soft-program time associated with the starting Vcg. In this manner, the closest starting Vcg and associated soft-program time are utilized as a closest or best guess (e.g., used in place of the default soft-program time in operation 810) for soft-programming the particular collection of memory cells, where the soft-program time can be adapted for the particular collection of memory cells during soft-program time optimization (e.g., operations 815-825). Otherwise, testing circuitry 130 calculates a new starting Vcg and soft-program time based on the present minimum OOF Vt.

Figure 5:
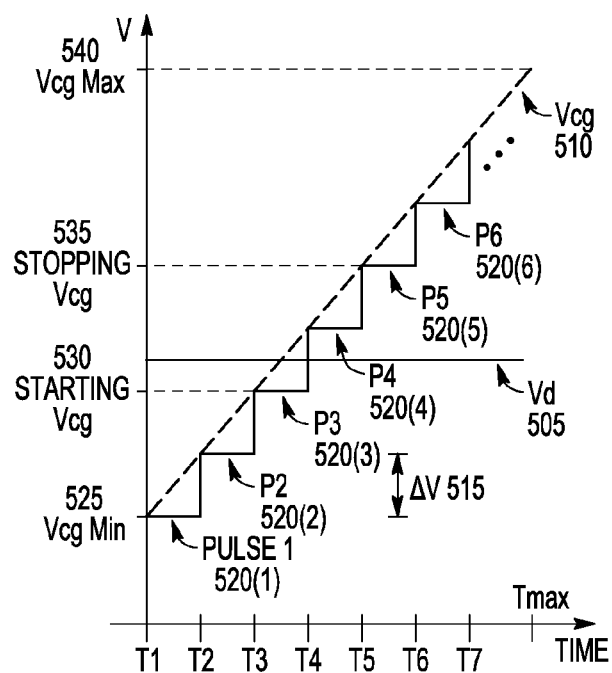
FIG. 5 illustrates a plot graph depicting an example soft-program control gate voltage ramp curve and soft-program drain voltage curve, according to some embodiments.

FIG. 5 illustrates a plot graph depicting an example soft-program control gate voltage (Vcg) ramp curve and soft-program drain voltage (Vd) curve on a plot graph having the x-axis representing time and the y-axis representing voltage. Soft-program Vd curve 505 represents the voltage applied to a drain electrode of an over-erased memory cell (e.g., to one or more over-erased memory cells in a row of memory array 115) during a soft-program operation, which is a constant voltage value.

Soft-program Vcg curve 510 represents the ramped voltage applied to a control gate electrode of an over-erased memory cell (e.g., to one or more over-erased memory cells in a row of memory array 115) during a soft-program operation, which increases at a predefined constant ramp voltage. In some embodiments, soft-program Vcg 510 is implemented in system 100 as a linearly increased ramped voltage (illustrated as a broken line in FIG. 5). In other embodiments, soft-program Vcg 510 is implemented in system 100 as a stepped ramped voltage (illustrated as a stepwise curve in FIG. 5), where soft-program Vcg is increased by a number of sequential voltage pulses that have a uniform height (e.g., an amount of voltage, illustrated as ΔV 515) and a uniform length (e.g., an amount of time, illustrated at intervals T1 through T7 having a same time or pulse length between them). In the embodiments illustrated in FIG. 4, the linearly increased soft-program Vcg (broken line) and stepped soft-program Vcg (stepwise curve) are equivalent due to being increased at the same predefined constant ramp voltage.

Soft-program Vcg 510 can be ramped over a predefined range of voltages, from a minimum Vcg value 525 to a maximum Vcg value 540. Ramping soft-program Vcg from minimum Vcg 525 to maximum Vcg 540 takes a maximum amount of soft-program time Tmax, which are the worst-case "hard" soft-program conditions (e.g., provides the longest soft-program time and the greatest soft-program Vcg to hard soft-program over-erased memory cells).

As discussed above, soft-program conditions are optimized for the over-erased memory cell(s) being soft-programmed using the minimum OOF Vt of the memory cells in which the over-erased memory cell(s) is included. A starting Vcg 530 and a soft-program time are determined, in the manner discussed above. Since the soft-program Vcg 510 is increased at a steady rate provided by the predefined constant ramp voltage from starting Vcg 530, a stopping voltage 535 is reached at the end of the optimized soft-program time.

In the embodiment illustrated in FIG. 5, soft-program Vcg 510 has the value of starting Vcg 530 at a time T3 and has a soft-program time equivalent to two pulse lengths. In embodiments where soft-program Vcg 510 is implemented in system 100 as a linearly increased voltage, soft-program Vcg 510 is increased (gradually) from starting Vcg 530 for an application time equivalent to two pulse lengths. In embodiments where soft-program Vcg 510 is implemented in system 100 as a stepped voltage, soft-program Vcg 510 is increased (stepped) from starting Vcg 530 for a pulse count of two. In both cases, by increasing the soft-program Vcg from starting Vcg 530 for an equivalent soft-program time of two pulse lengths, the soft-program Vcg reaches the value of stopping Vcg 535 at the end of the soft-program time at time T5. It is noted that the optimized soft-program time is much less than the maximum soft-program time.

Figure 6:
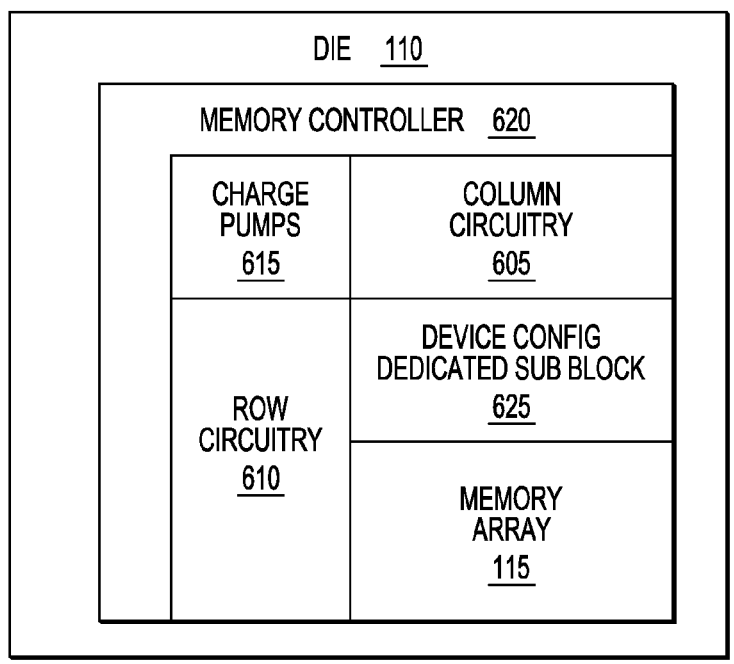
FIG. 6 illustrates a block diagram depicting example components of a memory cell array, according to some embodiments.

FIG. 6 is a block diagram depicting components associated with an example memory array 120 implemented on an example die 110. A memory system is implemented on die 110, where the memory system includes a memory controller 620, column circuitry 605, row circuitry 610, and charge pumps 615. A device configuration dedicated sub block 625 is also shown as a portion of memory array 115. These components are further discussed below.

Memory array 115 is a non-volatile memory (NVM) that includes a plurality of NVM memory cells (also referred to as memory cells) arranged in N rows and M columns, where each memory cell is configured to store a value of data, N and M being integers of one or more. Memory array 115 also includes a number of word lines that each correspond to a row of memory cells in memory array 115, and a number of bit lines that each correspond to a column of memory cells in memory array 115, where a number of memory cells are selected by activation of one or more word lines and bit lines. An example memory cell (MC) of memory array 115 is coupled to a control gate line (CG), a source line (SRC), a word line (WL), and a bit line (BL).

Each memory array 115 includes a dedicated sub-block storage area 625 designated for storing device configuration information 120, where sub-block 625 is not user-accessible. As discussed above, dedicated sub-block storage area 625 is configured to store a minimum OOF Vt associated with memory array 115, which is used to optimize soft-program conditions for any over-erased memory cells in memory array 115. The minimum OOF Vt may be determined solely from the OOF Vts measured for the memory cells in memory array 115, or may be determined from a larger collection of memory cells on die 110.

Column circuitry 605 includes bit line driver circuitry for activating bit lines and sense amplifiers for reading values of the memory cells (not shown). Row circuitry 610 includes one or more source line (SRC) drivers for applying a SRC voltage to one or more source lines, one or more control gate line (CG) drivers for applying CG voltage (including the optimized soft-program Vcg voltage) to one or more CG lines, and word line driver circuitry for activating word lines (not shown). Charge pumps 615 include circuitry configured to generate various voltage signals (including ramped voltage signals) needed by the CG, SRC, WL, and BL drivers of column circuitry 605 and row circuitry 610 to produce precondition (or program), erase, and soft-program conditions.

Memory controller 620 includes logic configured to control column circuitry 605, row circuitry 610, and charge pump 615 to apply precondition (or program), erase, and soft-program conditions to memory cells in memory array 115, according to the present disclosure. Memory controller 620 is also configured to access the dedicated sub-block storage area 625 to read device configuration information 120 associated with memory array 115 and provide device configuration information 120 to testing circuitry 130.

The non-volatile memory cells described herein can be implemented on a semiconductor substrate of any semiconductor material or combinations of materials, such as gallium arsenide, silicon germanium, silicon-on-insulator (SOI), silicon, monocrystalline silicon, the like, and combinations of the above.

By now it should be appreciated that there has been provided embodiments of a scheme to improve soft-programming time in non-volatile memories, based on device characteristics of NVM cells of a non-volatile memory. By tailoring the starting voltage of the soft-program control gate voltage to the minimum OOF Vt of a collection of NVM cells on a die and optimizing the amount of time during which the soft-program control gate voltage is applied to any over-erased NVM cells in the collection of NVM cells, the soft-program time for the collection of NVM cells is optimized. This (especially in the aggregate) reduces the soft-program time for a collection of NVM cells (such as a memory array).

In one embodiment of the present disclosure, a method of erasing a plurality of non-volatile memory (NVM) cells on a die is provided. The method includes applying erase signals to the plurality of NVM cells; identifying a subset of the plurality of NVM cells to be soft programmed; accessing information from a non-volatile storage location that stores a value to identify a particular magnitude from a plurality of possible magnitudes of a starting voltage; and applying a soft program signal to the NVM cells identified for soft programming, wherein the starting voltage of the soft program signal has the particular magnitude.

One aspect of the above embodiment provides that the method further includes detecting when all of the NVM cells identified for soft programming have been sufficiently soft programmed; and terminating application of the soft program signal.

Another aspect of the above embodiment provides that the applying the soft program signal is further characterized by the soft program signal being ramped in voltage in discrete steps.

Another aspect of the above embodiment provides that the applying the soft program signal is further characterized by the soft program signal being ramped linearly.

Another aspect of the above embodiment provides that the identifying the subset is further characterized by the subset including NVM cells that have a threshold voltage below a desired threshold voltage.

Another aspect of the above embodiment provides that the accessing information from a non-volatile storage location is further characterized by the non-volatile storage location being part of a sub-block of an NVM array, wherein the plurality of NVM cells are part of the NVM array separate from the sub-block and the sub-block is dedicated to storing device configuration information.

A further aspect of the above embodiment provides that the method, where the NVM array is part of a semiconductor die, further includes testing the NVM array prior to any programming or erasing of the NVM array to determine a lowest threshold voltage of all of the NVM cells of the NVM array, where the testing is performed using a tester that is external to the semiconductor die. The method also includes identifying the particular magnitude of the starting voltage based on the lowest threshold voltage of all of the NVM cells of the NVM array; and storing the value that identifies the particular magnitude of the starting voltage in the non-volatile storage location.

A still further aspect of the above embodiment provides that the method, where the NVM array is part of a semiconductor die, further includes defining a correlation between the lowest threshold voltage of all of the NVM cells and a desired magnitude of the starting voltage based on testing a plurality of die having NVM arrays.

Another aspect of the above embodiment provides that the applying erase signals is further characterized by using a charge pump.

Another aspect of the above embodiment provides that the plurality of NVM cells have a control gate and the applying a soft program signal to the NVM cells is further characterized by the control gates of the NVM cells identified for soft programming receiving the soft program signal.

In another embodiment of the present disclosure, a non-volatile memory (NVM) is provided and includes a plurality of NVM cells that are erased by a bulk erase followed by soft programming of a subset of the plurality of NVM cells; a storage location containing information from a non-volatile storage location that stores a value to identify a particular magnitude from a plurality of possible magnitudes for a starting voltage of a soft program signal used for soft programming; and a controller that accesses the storage location and soft programs the subset of the plurality of NVM cells with the soft program signal, wherein the starting voltage of the soft program signal is at the particular magnitude.

One aspect of the above embodiment provides that the NVM also includes a charge pump coupled to the controller.

A further aspect of the embodiment provides that the plurality of NVM cells have a control gate and the controller provides the soft program signal to the control gates of the subset of the plurality of NVM cells.

A still further aspect of the embodiment provides that the bulk erase occurs by tunneling and the soft programming occurs by hot carrier injection.

A still further aspect of the embodiment provides that the controller ramps the soft program signal in discrete steps.

A still further aspect of the embodiment provides that the controller ramps the soft program signal linearly by the discrete steps having equal voltages and times.

A still further aspect of the embodiment provides that the plurality of NVM cells are in an NVM array and the storage location is in a portion of the NVM array dedicated to device configuration information.

A still further aspect of the embodiment provides that the particular magnitude is higher for the case where the plurality memory cells have a threshold voltage distribution, prior to any programming or erasing of the NVM array, indicative of a more difficult programming and is lower for the case where the plurality of memory cells have a threshold voltage distribution, prior to any programming or erasing of the NVM array, indicative of a less difficult programming.

In another embodiment of the present disclosure, a method of erasing a plurality of non-volatile memory (NVM) cells on a die is provided. The method includes applying erase signals to the plurality of NVM cells; identifying a subset of the plurality of NVM cells to be soft programmed; accessing information from a non-volatile storage location that stores a value to identify a particular magnitude from a plurality of possible magnitudes of a starting voltage, where the particular magnitude is higher for the case where the plurality memory cells have a threshold voltage distribution, prior to any programming or erasing of the NVM array, indicative of a more difficult programming and is lower for the case where the plurality of memory cells have a threshold voltage distribution, prior to any programming or erasing of the NVM array, indicative of a less difficult programming; and applying a soft program signal to gates of the NVM cells identified for soft programming, wherein the starting voltage of the soft program signal has the particular magnitude.

One aspect of the above embodiment provides that the method further includes using a tester external to the die to store information as to a minimum threshold voltage of the plurality of NVM cells, prior to any programming or erasing of the NVM array, use the information to identify the particular magnitude, and provide the particular magnitude to the die for storage in the non-volatile storage location.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of erasing a plurality of non-volatile memory (NVM) cells on a die, comprising:
   applying erase signals to the plurality of NVM cells;
   identifying a subset of the plurality of NVM cells to be soft programmed;
   accessing information from a non-volatile storage location that stores a value that identifies a minimum threshold voltage of the plurality of NVM cells, wherein the minimum threshold voltage was measured at a time before any of the plurality of NVM cells were programmed or erased;
   determining a particular magnitude of a starting voltage based on the information; and
   applying a soft program signal to the subset of the plurality of NVM cells identified for soft programming, wherein the starting voltage of the soft program signal has the particular magnitude.

2. The method of claim 1, further comprising:
   detecting when all of the NVM cells identified for soft programming have been sufficiently soft programmed; and
   terminating application of the soft program signal.

3. The method of claim 1, wherein the applying the soft program signal is further characterized by the soft program signal being ramped in voltage in discrete steps.

4. The method of claim 1, wherein the applying the soft program signal is further characterized by the soft program signal being ramped linearly.

5. The method of claim 1, wherein, the identifying the subset is further characterized by the subset including NVM cells that have a threshold voltage below a desired threshold voltage.

6. The method of claim 1, wherein the accessing information from a non-volatile storage location is further characterized by the non-volatile storage location being part of a sub-block of an NVM array, wherein the plurality of NVM cells are part of the NVM array separate from the sub-block and the sub-block is dedicated to storing device configuration information.

7. The method of claim 6, wherein the NVM array is part of a semiconductor die, further comprising:
   testing the NVM array prior to any programming or erasing of the NVM array to determine the minimum threshold voltage of all of the NVM cells of the NVM array, wherein the testing is performed using a tester that is external to the semiconductor die;
   identifying the particular magnitude of the starting voltage based on the minimum threshold voltage of all of the NVM cells of the NVM array; and
   storing the value in the non-volatile storage location, wherein the value also identifies the particular magnitude of the starting voltage.

8. The method of claim 7, wherein the NVM array is part of a semiconductor die, further comprising:
   defining a correlation between the minimum threshold voltage of all of the NVM cells and a desired magnitude of the starting voltage based on testing a plurality of die having NVM arrays.

9. The method of claim 1, wherein the applying erase signals is further characterized by using a charge pump.

10. The method of claim 1, wherein the plurality of NVM cells have a control gate and the applying a soft program signal to the NVM cells is further characterized by the control gates of the NVM cells identified for soft programming receiving the soft program signal.

11. A non-volatile memory (NVM), comprising:
    a plurality of NVM cells that are erased by a bulk erase;
    a non-volatile storage location different from the plurality of NVM cells that are erased, the non-volatile storage location configured to store a value that identifies a minimum threshold voltage of the plurality of NVM cells, wherein the minimum threshold voltage was measured at a time before any of the plurality of NVM cells were programmed or erased; and
    a controller configured to:
        identify a subset of the plurality of NVM cells to be soft programmed,
        access information from the non-volatile storage location,
        determine a particular magnitude for a starting voltage based on the information, and soft program the subset of the plurality of NVM cells with a soft program signal, wherein the starting voltage of the soft program signal is at the particular magnitude.

12. The NVM of claim 11, further comprising:
    a charge pump coupled to the controller.

13. The NVM of claim 12, wherein the plurality of NVM cells have a control gate and the charge pump provides the soft program signal to the control gates of the subset of the plurality of NVM cells.

14. The NVM of claim 11, wherein the bulk erase occurs by tunneling and the soft programming occurs by hot carrier injection.

15. The NVM of claim 11, wherein the controller ramps the soft program signal in discrete steps.

16. The NVM of claim 15, wherein the controller ramps the soft program signal linearly by the discrete steps having equal voltages and times.

17. The NVM of claim 16, wherein the plurality of NVM cells are in an NVM array and the storage location is in a portion of the NVM array dedicated to device configuration information.

18. The NVM of claim 17, wherein the particular magnitude is higher for the case where the plurality of memory cells have a threshold voltage distribution, prior to any programming or erasing of the NVM array, indicative of a more difficult programming and is lower for the case where the plurality of memory cells have a threshold voltage distribution, prior to any programming or erasing of the NVM array, indicative of a less difficult programming.

19. A method of erasing a plurality of non-volatile memory (NVM) cells on a die, comprising:
    applying erase signals to the plurality of NVM cells;
    identifying a subset of the plurality of NVM cells to be soft programmed;
    accessing information from a non-volatile storage location that stores a value to identify a particular magnitude from a plurality of possible magnitudes of a starting voltage, wherein the particular magnitude is higher for the case where the plurality of memory cells have a threshold voltage distribution, prior to any programming or erasing of the NVM array, indicative of a more difficult programming and is lower for the case where the plurality of memory cells have a threshold voltage distribution, prior to any programming or erasing of the NVM array, indicative of a less difficult programming; and
    applying a soft program signal to gates of the subset of the plurality of NVM cells identified for soft programming, wherein the starting voltage of the soft program signal has the particular magnitude.

20. The method of claim 19, further comprising using a tester external to the die to store information as to a minimum threshold voltage of the plurality of NVM cells, prior to any programming or erasing of the NVM array, use the information to identify the particular magnitude, and provide the particular magnitude to the die for storage in the non-volatile storage location.

\* \* \* \* \*